United States Patent
Liu et al.

(10) Patent No.: US 11,461,204 B2
(45) Date of Patent: Oct. 4, 2022

(54) DATA PROCESSING CIRCUIT AND FAULT-MITIGATING METHOD

(71) Applicant: Skymizer Taiwan Inc., Taipei (TW)

(72) Inventors: Shu-Ming Liu, Taipei (TW); Kai-Chiang Wu, Hsinchu (TW); Wen Li Tang, Taipei (TW)

(73) Assignee: Skymizer Taiwan Inc., Taipei (TW)

( * ) Notice: Subject to any disclaimer, the term of this patent is extended or adjusted under 35 U.S.C. 154(b) by 0 days.

(21) Appl. No.: 17/213,210

(22) Filed: Mar. 25, 2021

(65) Prior Publication Data

US 2022/0138064 A1     May 5, 2022

(30) Foreign Application Priority Data

Nov. 4, 2020   (TW) .................................. 109138483

(51) Int. Cl.
*G06F 11/20*      (2006.01)
*G06F 7/544*      (2006.01)
(Continued)

(52) U.S. Cl.
CPC ........ *G06F 11/2094* (2013.01); *G06F 7/5443* (2013.01); *G11C 7/1006* (2013.01); *G11C 29/88* (2013.01); *G06F 2201/82* (2013.01)

(58) Field of Classification Search
CPC ............... G06F 11/2094; G06F 7/5443; G06F 2201/82; G11C 7/1006; G11C 29/88
See application file for complete search history.

(56) References Cited

U.S. PATENT DOCUMENTS

| 7,299,377 | B2 | 11/2007 | Norman |
| 10,146,535 | B2 | 12/2018 | Corbal et al. |

(Continued)

FOREIGN PATENT DOCUMENTS

| CN | 109324921 | 2/2019 |
| CN | 107633295 | 4/2020 |

(Continued)

OTHER PUBLICATIONS

H. Sim and J. Lee, "A new stochastic computing multiplier with application to deep convolutional neural networks," 2017 54th ACM/EDAC/IEEE Design Automation Conference (DAC), 2017, pp. 1-6, doi: 10.1145/3061639.3062290. (Year: 2017).*

(Continued)

*Primary Examiner* — Ajay Ojha
(74) *Attorney, Agent, or Firm* — JCIPRNET

(57) ABSTRACT

A data processing circuit and a fault-mitigating method, which are adapted for a memory having a faulty bit, are provided. The memory is configured to store data related to an image, a weight for a multiply-accumulate (MAC) operation of image feature extraction, and/or a value for an activation operation. Sequence data is written into the memory. The bit number of the sequence data equals to the bit number used for storing data in a sequence block of the memory. The sequence data is accessed from the memory, wherein the access of the faulty bit in the memory is ignored. The value of the faulty bit is replaced by the value of a non-faulty bit in the memory to form new sequence data. The new sequence data is used for MAC. Accordingly, the accuracy of image recognition can be improved for the faulty memory.

14 Claims, 6 Drawing Sheets

(51) Int. Cl.
*G11C 29/00* (2006.01)
*G11C 7/10* (2006.01)

(56) References Cited

U.S. PATENT DOCUMENTS

| | | | |
|---|---|---|---|
| 11,263,077 B1* | 3/2022 | Seznayov | G06F 3/064 |
| 2019/0189221 A1* | 6/2019 | Kim | G11C 19/287 |
| 2021/0312310 A1* | 10/2021 | Wu | G06K 9/6201 |
| 2021/0318922 A1* | 10/2021 | Roberts | G06F 3/0619 |

FOREIGN PATENT DOCUMENTS

| | | |
|---|---|---|
| TW | I283349 | 7/2007 |
| TW | 201218070 | 5/2012 |
| TW | 201531856 | 8/2015 |

OTHER PUBLICATIONS

"Office Action of Taiwan Counterpart Application", dated Jun. 1, 2021, p. 1-p. 6.
Shu-Ming Liu et al., "Fault-Tolerance Mechanism Analysis on NVDLA-Based Design Using Open Neural Network Compiler and Quantization Calibrator", 2020 International Symposium on VLSI Design, Automation and Test (VLSI-DAT), Aug. 10, 2020, pp. 1-3.

\* cited by examiner

| B0_7 | B0_6 | B0_5 | B0_4 | B0_3 | B0_2 | B0_1 | B0_0 |
|---|---|---|---|---|---|---|---|
| B1_7 | B1_6 | B1_5 | B1_4 | B1_3 | B1_2 | B1_1 | B1_0 |
| B2_7 | B2_6 | B2_5 | B2_4 | B2_3 | B2_2 | B2_1 | B2_0 |
| B3_7 | B3_6 | B3_5 | B3_4 | B3_3 | B3_2 | B3_1 | B3_0 |

FIG. 4A

| B0_7 | B0_6 | B0_5 | X | B0_3 | B0_2 | B0_1 | B0_0 |
|---|---|---|---|---|---|---|---|
| B1_7 | B1_6 | B1_5 | X | B1_3 | B1_2 | B1_1 | B1_0 |
| B2_7 | B2_6 | B2_5 | X | B2_3 | B2_2 | B2_1 | B2_0 |
| B3_7 | B3_6 | B3_5 | X | B3_3 | B3_2 | B3_1 | B3_0 |

FIG. 4B

| B0_7 | B0_6 | B0_5 | B0_3 | B0_3 | B0_2 | B0_1 | B0_1 |
|---|---|---|---|---|---|---|---|
| B1_7 | B1_6 | B1_5 | B1_3 | B1_3 | B1_2 | B1_1 | B1_1 |
| B2_7 | B2_6 | B2_5 | B2_3 | B2_3 | B2_2 | B2_1 | B2_1 |
| B3_7 | B3_6 | B3_5 | B3_3 | B3_3 | B3_2 | B3_1 | B3_1 |

FIG. 4C

| B0_7 | B0_6 | B0_5 | X | B0_4 | B0_3 | B0_2 | B0_1 |
|---|---|---|---|---|---|---|---|
| B1_7 | B1_6 | B1_5 | X | B1_4 | B1_3 | B1_2 | B1_1 |
| B2_7 | B2_6 | B2_5 | X | B2_4 | B2_3 | B2_2 | B2_1 |
| B3_7 | B3_6 | B3_5 | X | B3_4 | B3_3 | B3_2 | B3_1 |

FIG. 5A

| B0_7 | B0_6 | B0_5 | B0_4 | B0_3 | B0_2 | B0_1 | B0_1 |
|---|---|---|---|---|---|---|---|
| B1_7 | B1_6 | B1_5 | B1_4 | B1_3 | B1_2 | B1_1 | B1_1 |
| B2_7 | B2_6 | B2_5 | B2_4 | B2_3 | B2_2 | B2_1 | B2_1 |
| B3_7 | B3_6 | B3_5 | B3_4 | B3_3 | B3_2 | B3_1 | B3_1 |

FIG. 5B

| B0_7 | B0_6 | B0_5 | B0_4 | B0_3 | B0_2 | B0_1 | 0 |
|---|---|---|---|---|---|---|---|
| B1_7 | B1_6 | B1_5 | B1_4 | B1_3 | B1_2 | B1_1 | 0 |
| B2_7 | B2_6 | B2_5 | B2_4 | B2_3 | B2_2 | B2_1 | 0 |
| B3_7 | B3_6 | B3_5 | B3_4 | B3_3 | B3_2 | B3_1 | 0 |

FIG. 5C

| F0_7 | F0_6 | F0_5 | F0_4 | F0_3 | F0_2 | F0_1 | F0_0 |
|------|------|------|------|------|------|------|------|
| F1_7 | F1_6 | F1_5 | F1_4 | F1_3 | F1_2 | F1_1 | F1_0 |
| F2_7 | F2_6 | F2_5 | F2_4 | F2_3 | F2_2 | F2_1 | F2_0 |
| F3_7 | F3_6 | F3_5 | F3_4 | F3_3 | F3_2 | F3_1 | F3_0 |

FIG. 6A

| B0_7 | B0_6 | B0_5 | F0_4 | B0_3 | B0_2 | B0_1 | B0_0 |
|------|------|------|------|------|------|------|------|
| B1_7 | B1_6 | B1_5 | F1_4 | B1_3 | B1_2 | B1_1 | B1_0 |
| B2_7 | B2_6 | B2_5 | F2_4 | B2_3 | B2_2 | B2_1 | B2_0 |
| B3_7 | B3_6 | B3_5 | F3_4 | B3_3 | B3_2 | B3_1 | B3_0 |

FIG. 6B

DATA PROCESSING CIRCUIT AND FAULT-MITIGATING METHOD

CROSS-REFERENCE TO RELATED APPLICATION

This application claims the priority benefit of Taiwan application serial no. 109138483, filed on Nov. 4, 2020. The entirety of the above-mentioned patent application is hereby incorporated by reference herein and made a part of this specification.

BACKGROUND

Technical Field

The disclosure relates to a data processing mechanism, and particularly relates to a data processing circuit and a fault-mitigating method.

Description of Related Art

Neural network is an important subject in artificial intelligence (AI), which makes decisions by simulating how human brain cells work. It is worth noting that there are many neurons in human brain cells, and these neurons are connected to each other through synapses. Each neuron can receive a signal through the synapse and transmit the output obtained by transforming the signal to another neuron. The transformation ability of each neuron is different, and human beings have the ability of thinking and judgment through the aforementioned signal transmission and transformation. The neural network obtains the corresponding ability based on the aforementioned operation.

Neural network is often used for image recognition. In the operation of each neuron, an input component is multiplied by a weight of the corresponding synapse (possibly with a bias) and then output through the operation of a non-linear function (for example, an activation function) to capture image features. However, the memory used to store the input values, weight values, and function parameters may inevitably have poor yield, causing fault/damage of some storage blocks (for example, hard errors) and consequently affecting the completeness or accuracy of the stored data. For convolutional neural network (CNN), after the convolution operation is performed, such fault/damage will seriously affect the result of image recognition. For example, if the fault occurs in a higher bit, the recognition success rate may approach zero.

SUMMARY

Embodiments of the disclosure provide a data processing circuit and a fault-mitigating method, which fill in correct data based on the high similarity between adjacent features in an image, so as to improve the accuracy of image recognition.

A fault-mitigating method according to an embodiment of the disclosure is adapted for a memory having one or more faulty bits. The memory is configured to store at least one of data related to an image, a weight for a multiply-accumulate operation for feature extraction of the image, and a value for an activation operation. The fault-mitigating method includes (but not limited to) the following. Sequence data is written into the memory. A number of bits of the sequence data is equal to a number of bits for storing data in a sequence block of the memory. The sequence data is accessed from the memory, including: ignoring access to one or more faulty bits in the memory. Values on bits corresponding to the faulty bits in the sequence data are replaced with values on one or more non-faulty bits in the memory to form new sequence data. The new sequence data is configured for the multiply-accumulate operation.

A data processing circuit according to an embodiment of the disclosure includes (but not limited to) a memory, a multiply accumulator, and a controller. The memory is configured to store at least one of data related to an image, a weight for a multiply-accumulate operation for feature extraction of the image, and a value for an activation operation, and has one or more faulty bits. The multiply accumulator is configured to perform the multiply-accumulate operation. The controller is coupled to the memory and the multiply accumulator, and configured to perform the following. Sequence data is written into the memory. A number of bits of the sequence data is equal to a number of bits for storing data in a sequence block of the memory. The sequence data is accessed from the memory, including: ignoring access to one or more faulty bits in the memory. Values on bits corresponding to the faulty bits in the sequence data are replaced with values on one or more non-faulty bits in the memory to form new sequence data. The new sequence data is configured for the multiply-accumulate operation.

Based on the above, the data processing circuit and the fault-mitigating method according to the embodiments of the disclosure do not access the faulty bit but replace the data on the faulty bit with the value on another non-faulty bit, thereby improving the accuracy of image recognition. In addition, even if there is an error in the higher bit, the recognition function still has acceptable accuracy.

In order to make the above more comprehensible, the following specific embodiments are described in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 4A is an example illustrating the correct data stored in a normal memory.

FIG. 4B is an example illustrating the data stored in a faulty memory.

FIG. 4C is an example illustrating the data replaced using an adjacent non-faulty bit.

FIG. 5A is an example illustrating the data stored in a faulty memory.

FIG. 5B is an example illustrating the data that is shifted and whose lowest bit is replaced using an adjacent non-faulty bit.

FIG. 5C is an example illustrating the data that is shifted and whose lowest bit is filled with zero.

FIG. 6A is an example illustrating the data of another channel.

FIG. 6B is an example illustrating the data replaced using an adjacent channel.

DETAILED DESCRIPTION OF DISCLOSED EMBODIMENTS

Figure 1:
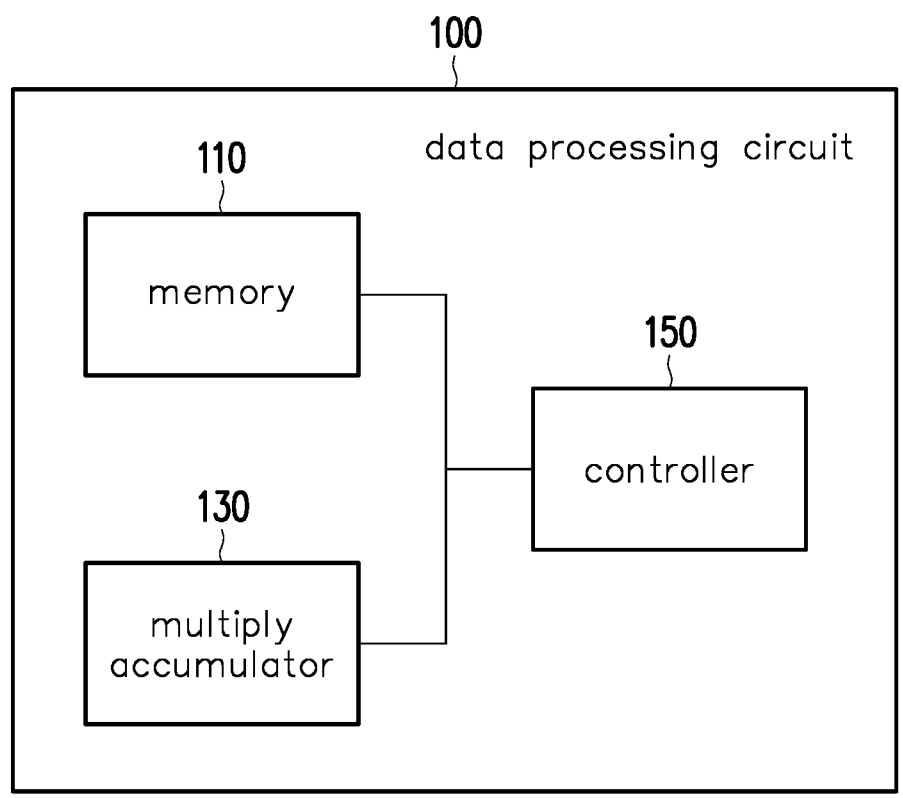
FIG. 1 is a block diagram of components of a data processing circuit according to an embodiment of the disclosure.

FIG. 1 is a block diagram of components of a data processing circuit 100 according to an embodiment of the disclosure. Referring to FIG. 1, the data processing circuit 100 includes (but not limited to) a memory 110, a multiply accumulator 130, and a controller 150.

The memory 110 may be a static or dynamic random access memory (RAM), a read-only memory (ROM), a flash memory, a register, a combinational circuit, or a combination of the foregoing components. In an embodiment, the memory 110 is configured to store data related to an image, a weight used for a multiply-accumulate (MAC) operation for feature extraction of the image, and/or a value used for an activation operation. In other embodiments, the user may determine the type of data stored in the memory 110 according to actual needs. In some embodiments, the memory 110 has one or more faulty bits. The faulty bit refers to a bit having a fault/damage (which can be called a hard error or a permanent fault) caused by process negligence or other factors so that the access result is different from the actual stored content. These faulty bits have been detected in advance, and the location information thereof in the memory 110 is available for the controller 150.

The multiply accumulator 130 may be a special circuit with multiplication and addition operations or may also be a circuit or processor composed of one or more multipliers and adders. In an embodiment, the multiply accumulator 130 is configured to perform the multiply-accumulate operation.

The controller 150 is coupled to the memory 110 and the multiply accumulator 130. The controller 150 may be a circuit composed of one or more of multiplexers, adders, multipliers, encoders, decoders, or various types of logic gates, and may be a central processing unit (CPU), a programmable general-purpose or special-purpose microprocessor, a digital signal processor (DSP), a programmable controller, an application-specific integrated circuit (ASIC), other similar components, or a combination of the foregoing components. In some embodiments, the operation of the processor 150 may be implemented by software.

Figure 2:
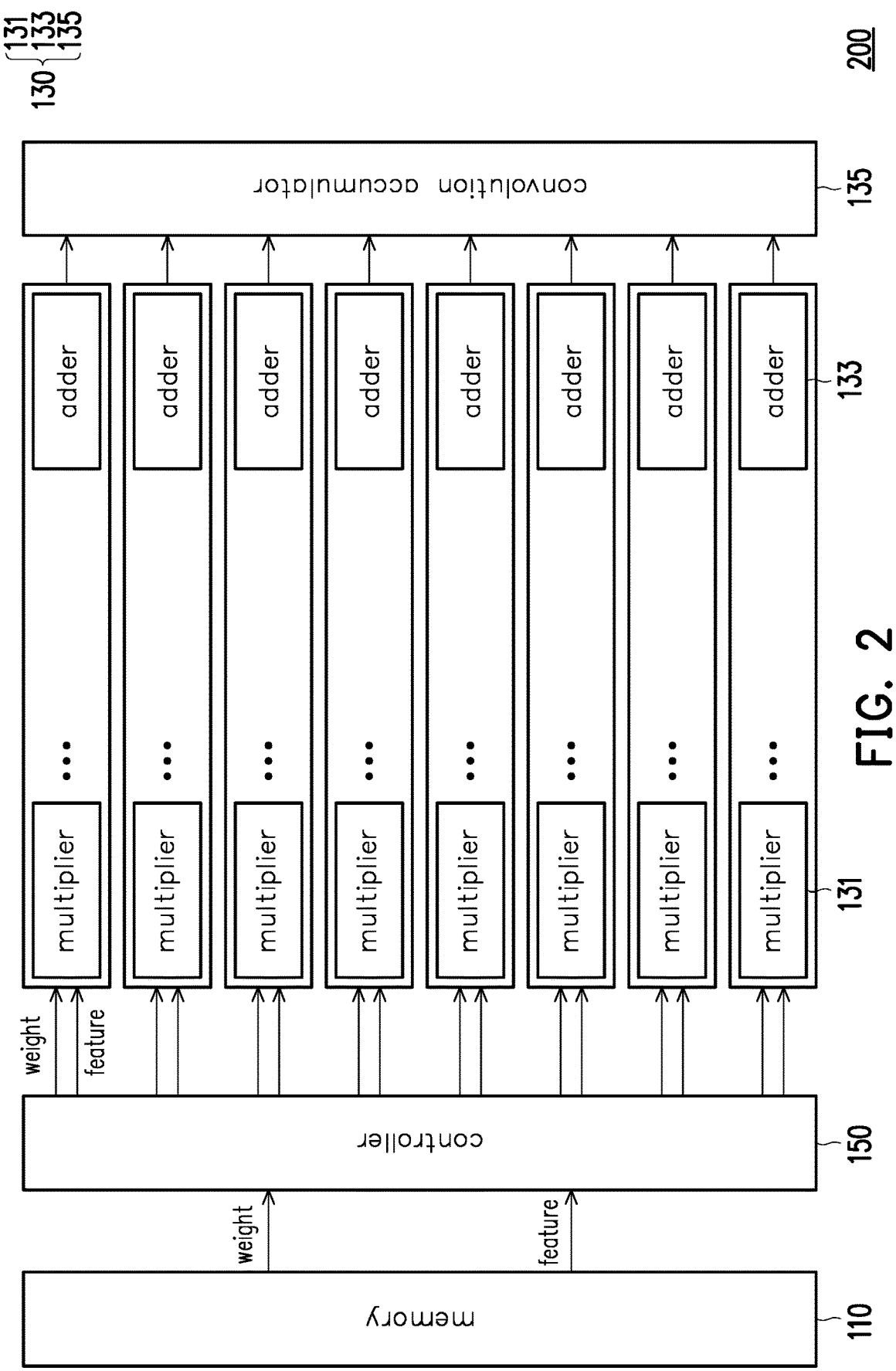
FIG. 2 is a block diagram of some components of a deep learning accelerator according to an embodiment of the disclosure.

FIG. 2 is a block diagram of some components of a deep learning accelerator 200 according to an embodiment of the disclosure. Referring to FIG. 2, the deep learning accelerator 200 includes the memory 110, the multiply accumulator 130, and the controller 150. The memory 110 serves as a buffer for a convolution operation (for example, a static random access memory (SRAM)) and is configured to store a weight used for the convolution operation and a feature in the image. The controller 150 serves as a sequence controller for the convolution operation and inputs the weight and feature of the sequence to the multiply accumulator 130 respectively. The multiply accumulator 130 includes one or more multipliers 131, one or more adders 133, and a convolution accumulator 135. Each multiplier respectively multiplies one weight and one feature, adds a bias through the adder 133, and accumulates the partial summation through the convolution accumulator 135.

It should be noted that the data processing circuit 100 is not necessarily applied to the deep learning accelerator 200 (for example, inception_v3, resnet101, or resnet152) and may be applied to any technical field that requires the multiply-accumulate operation.

Hereinafter, the method according to the embodiment of the disclosure will be described with reference to various components or circuits in the data processing circuit 100. The processes of the method may be adjusted according to the actual situation and is not limited to the description.

Figure 3:
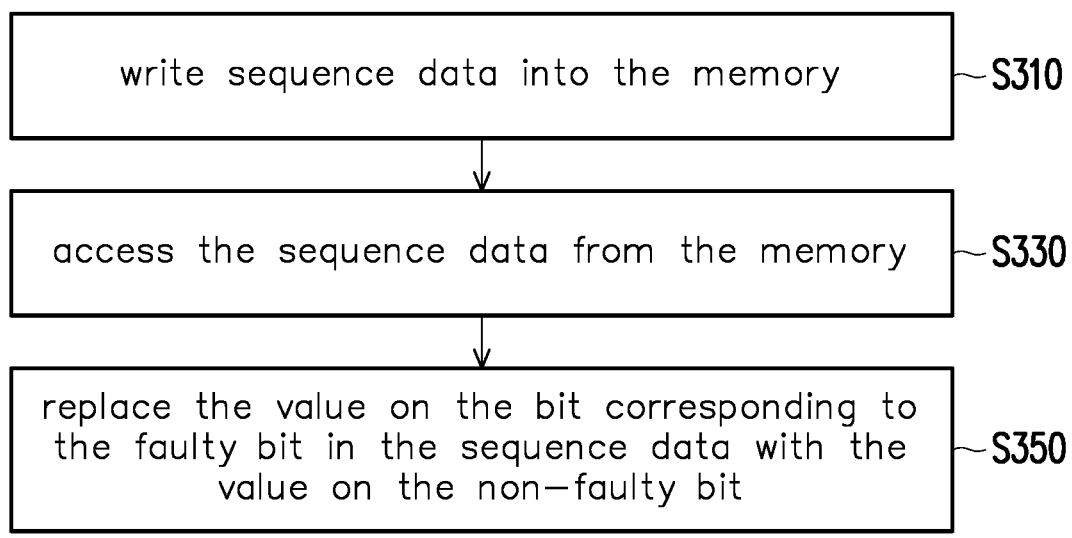
FIG. 3 is a flowchart of a fault-mitigating method according to an embodiment of the disclosure.

FIG. 3 is a flowchart of a fault-mitigating method according to an embodiment of the disclosure. Referring to FIG. 3, the controller 150 writes sequence data into the memory 110 (step S310). Specifically, the sequence data is, for example, data related to an image (for example, the grayscale value, feature value, etc. of a pixel), a weight used for a multiply-accumulate operation, or a value used for an activation operation. The values in the sequence data are arranged according to a specific rule (for example, pixel location, convolution kernel definition location, operation order, etc.). The number of bits of one piece of sequence data is equal to or smaller than the number of bits used to store data in a certain sequence block of the memory 110. For example, the number of bits is 8, 12, or 16 bits. Taking FIG. 2 as an example again, one piece of sequence data is 8 bits, which means that the weight of 8 bits is multiplied by the feature of 8 bits in a one-to-one correspondence manner.

In an embodiment, the controller 150 may ignore the location of the faulty bit in the memory 110 and write the data into the memory 110 according to the original sequence of the sequence data. In other words, some values of the sequence data are written into the faulty bit.

For example, FIG. 4A is an example illustrating the correct data stored in a normal memory. Referring to FIG. 4A, it is assumed that the normal memory has no faulty bit. The normal memory records four pieces of sequence data (including values B0_0 to B0_7, B1_0 to B1_7, B2_0 to B2_7, and B3_0 to B3_7). The original sequence here refers to that the sequence from the lowest bit to the highest bit is B0_0, B0_1, B0_2, . . . , B0_7, and so on.

FIG. 4B is an example illustrating the data stored in a faulty memory. Referring to FIG. 4B, it is assumed that the faulty bit (indicated by "X") of the faulty memory is located in the fourth bit. If the four pieces of sequence data in FIG. 4A are written into the faulty memory, the value B0_0 is stored in the zeroth bit, the value B0_1 is stored in the first bit, and so on. In addition, the values B0_4, B1_4, B2_4, and B3_4 are still written into the faulty bits. That is, the value of the fourth bit is still written into the faulty bit of the fourth bit. If the faulty bit is accessed, the correct value may not be obtained.

In an embodiment, the controller 150 may disable the writing of the sequence data into the faulty bit and write the sequence data into non-faulty bits in sequence. The difference from the previous embodiment is that the sequence data is not written into the faulty bits. The non-faulty bit means that the bit has no damage or fault and can be accessed to obtain the correct value.

In some embodiments, the controller 150 includes a barrel shifter to shift the sequence data by a specific number of bits within one clock cycle. The barrel shifter may shift some values in the sequence data to the lower bits starting from the faulty bit. The number of bits shifted is based on the number of faulty bits. For example, if only the fourth bit is the faulty bit, the values of the fourth bit to the zeroth bit are shifted by one bit. For another example, if the fourth bit and the fifth bit are faulty bits, the values of the fourth bit to the zeroth bit are shifted by two bits.

For example, FIG. 5A is an example illustrating the data stored in a faulty memory. Referring to FIG. 4A and FIG.

5A, it is assumed that the faulty bit of the faulty memory is located in the fourth bit. If the four pieces of sequence data in FIG. 4A are written into the faulty memory, the value B0_0 is stored in the zeroth bit, the value B0_1 is stored in the first bit, and so on. In addition, the values B0_4, B0_3, B0_2, and B0_1 are shifted by one bit. That is, the value of the fourth bit is not written into the faulty bit of the fourth bit.

In other embodiments, the controller 150 may also control the location for writing the data by software.

Referring to FIG. 3, the controller 150 accesses the sequence data from the memory 110 (step S330). Specifically, if there is a multiply-accumulate operation or other needs, the controller 150 may access the sequence data as the input data of the multiply accumulator 130. It is worth noting that since the error value is accessed from the faulty bit, the controller 150 may ignore the access to the value on one or more faulty bits in the memory 110. Taking FIG. 4B and FIG. 5A as an example, the controller 150 may disable the access to the faulty bit (that is, the fourth bit).

In addition, for the non-faulty bits that are higher than the faulty bit, the controller 150 may arrange the values of the non-faulty bits according to the original sequence. For example, FIG. 4C is an example illustrating the data replaced using an adjacent non-faulty bit. Referring to FIG. 4B and FIG. 4C, the values originally located in the seventh bit to the fifth bit in the memory 110 are still arranged in the seventh bit to the fifth bit. For example, the values B0_7 to B0_5 are still arranged in the seventh bit to the fifth bit.

In an embodiment, for the non-faulty bits that are lower than the faulty bit, the controller 150 also arranges the values of the non-faulty bits according to the original sequence. For example, referring to FIG. 4B and FIG. 4C, the values originally located in the third bit to the zeroth bit in the memory 110 are still arranged in the third bit to the zeroth bit. For example, the values B0_3 to B0_0 are still arranged in the third bit to the zeroth bit.

In another embodiment, for the non-faulty bits that are lower than the faulty bit, the controller 150 shifts the values of the non-faulty bits that are lower than the faulty bit to the higher bits with the faulty bit as a reference. Since the faulty bit is not accessed, the value in the corresponding location is vacant. The controller 150 may shift the values stored in the non-faulty bits to the higher bits to fill the vacancy.

For example, FIG. 5B is an example illustrating the data that is shifted and whose lowest bit is replaced using an adjacent non-faulty bit. Referring to FIG. 5A and FIG. 5B, the values of the third bit to the zeroth bit in the memory 110 shown in FIG. 5A are shifted to the fourth bit to the first bit shown in FIG. 5B. For example, the values B0_4 to B0_1 are shifted by one bit to the left of the drawing. Similarly, the number of bits shifted is based on the number of faulty bits. Referring to FIG. 4A again, in fact, the values B0_4 to B0_1 written into the memory 110 have been shifted to the lower bits. After these values B0_4 to B0_1 are accessed, the locations thereof are restored to the locations originally arranged as shown in FIG. 4A.

Referring to FIG. 3, the controller 150 replaces the values on the bits corresponding to the faulty bits in the sequence data with the values on one or more non-faulty bits in the memory 110 to form new sequence data (step S350). Specifically, since the values of the faulty bits are not accessed, some values in the sequence data are not accessed. The controller 150 may fill the vacancies with the values on the non-faulty bits (that is, the correct values) to generate new sequence data. Some values in the new sequence data are different from the values in the original sequence data in the same bit locations (corresponding to the locations of the faulty bits).

In an embodiment, the controller 150 may replace the value with the value on the non-faulty bit adjacent to the faulty bit in the sequence data. For example, the controller 150 copies or repeatedly accesses the value on the bit that is adjacent to and higher or lower than the faulty bit.

Taking FIG. 4A as an example, the value of the fourth bit in the new sequence data is the same as the value of the third bit. For another example, the value of the fourth bit in the new sequence data is the same as the value of the fifth bit (not shown in the drawing). However, in some embodiments, instead of using the adjacent non-faulty bit, the controller 150 may replace the value on the faulty bit with the values on other non-faulty bits in the same sequence data.

In another embodiment, if the access method is to shift the value of the non-faulty bit lower than the faulty bit to the higher bit, the controller 150 replaces the value on the faulty bit with the value of the bit that is adjacent to and lower than the faulty bit. As shown in FIG. 5B, the values B0_4, B1_4, B2_4, and B3_4 corresponding to the third bit in the memory 110 are rearranged in the fourth bit after being accessed.

It is worth noting that the aforementioned access method of shifting to the higher bit causes the lowest one or more bits to be vacant. Taking FIG. 5A as an example, the shift to the left of the drawing causes the vacancy in the lowest bit (the zeroth bit) of the new sequence data. In an embodiment, the controller 150 may fill the lower bit that does not have a value yet in the new sequence data (that is, the vacancy of the aforementioned lowest bit) with the value on the adjacent bit. The adjacent bit is, for example, the second lowest bit, the third lowest bit, or other bits depending on the number of faulty bits. Taking FIG. 5B as an example, for the value of the lowest bit, the controller 150 fills it with the value of the second lowest bit (that is, the first bit). That is, the value of the zeroth bit is the same as the value of the first bit.

It should be noted that in other embodiments, the controller 150 may also fill the values of the lower bits with the values of other bits in the same new sequence data.

In another embodiment, the controller 150 may fill the lower bit that does not have a value yet in the new sequence data with "0 (zero)". That is, the aforementioned lowest bit has the value of "0". For example, FIG. 5C is an example illustrating the data that is shifted and whose lowest bit is filled with "0". Referring to FIG. 5C, regarding the value of the lowest bit, the controller 150 fills it with "0". That is, the value of the zeroth bit is "0".

It should be noted that in other embodiments, the controller 150 may also fill the value of the lower bit with "1 (one)".

In addition to replacing the value of the faulty bit with another value in the same sequence data or the same channel/sequence block, in an embodiment, the controller 150 may replace it with the value on the non-faulty bit corresponding to the sequence of one or more faulty bits in another sequence block of the memory 110. Specifically, the data stored in a sequence block and another sequence block correspond to different channels of the neural network. Different channels are different representation forms of the input data. Taking an image as an example, there may be three channels which are red, blue, and green, that is, the pixel values corresponding to the light sensitivities of red, blue, and green, respectively. In addition, as the convolutional layers increase, the number of channels may also gradually increase. If a faulty bit is found in one channel and the bit in the same location in another channel of the same convolutional layer is a non-faulty bit, then the value of the faulty bit may be replaced with the value of the non-faulty bit in another channel.

For example, FIG. 6A is an example illustrating the data of another channel. Referring to FIG. 6A, it is assumed that another sequence block used to store the features of another channel has no faulty bit. The sequence block records four pieces of sequence data (including values F0_0 to F0_7, F1_0 to F1_7, F2_0 to F2_7, and F3_0 to F3_7). The sequence here refers to that the sequence from the lowest bit to the highest bit is F0_0, F0_1, F0_2, . . . , F0_7, and so on.

FIG. 6B is an example illustrating the data replaced using an adjacent channel. Referring to FIG. 4B, FIG. 6A, and FIG. 6B, it is assumed that a certain channel of the memory 110 has a faulty bit as shown in FIG. 4B. In the process of accessing the memory 110, the controller 150 uses the values F0_4, F1_4, F2_4, and F3_4 of the fourth bit corresponding to the faulty bit shown in FIG. 6A as the values of the fourth bit in the new sequence data, respectively.

It should be noted that the multiply accumulator 130 may perform a multiply-accumulate operation on the new sequence data. Because of the high similarity/correlation between adjacent features of the image, the inference of a feature map formed based on the new sequence data may also have acceptable recognition accuracy. For example, the accuracy rate may exceed 70%. Compared with the accuracy rate approaching zero due to no repair, it is significantly improved.

In addition, the aforementioned examples of FIG. 4A to FIG. 6B are based on one piece of sequence data having one faulty bit. Even if there is more than one faulty bit in the actual situations, the fault-mitigating method according to the embodiments of the disclosure is still applicable for filling the data of the faulty bit.

In summary, in the data processing circuit and the fault-mitigating method according to the embodiments of the disclosure, one or more faulty bits in the memory may not be accessed. In addition, the value corresponding to the faulty bit in the new sequence data may be replaced with the value of another non-faulty bit or a preset value. In this way, for the faulty memory, the accuracy of image recognition is effectively improved. For applications of artificial intelligence (AI) related to convolutional neural networks, the disclosure also provides solutions with lower complexity.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A fault-mitigating method, adapted for a memory having at least one faulty bit, wherein the memory is configured to store at least one of data related to an image, a weight for a multiply-accumulate operation for feature extraction of the image, and a value for an activation operation, the fault-mitigating method comprising:
   writing sequence data into the memory, wherein a number of bits of the sequence data is equal to a number of bits for storing data in a sequence block of the memory;
   accessing the sequence data from the memory, comprising:
      ignoring access to the at least one faulty bit in the memory; and
   replacing a value on a bit corresponding to the at least one faulty bit in the sequence data with a value on at least one non-faulty bit in the memory to form new sequence data, wherein the new sequence data is configured for the multiply-accumulate operation,
   at least one value on at least one first bit in the new sequence data is equal to at least one value on at least one second bit in a same new sequence data, at least one value on at least one third bit in another new sequence data of another channel of a neural network, or zero.

2. The fault-mitigating method according to claim 1, wherein replacing the value on the bit corresponding to the at least one faulty bit in the sequence data with the value on the at least one non-faulty bit in the memory comprises:
   replacing with the value on the at least one non-faulty bit adjacent to the at least one faulty bit in the sequence data, wherein the at least one non-faulty bit is the at least one second bit.

3. The fault-mitigating method according to claim 1, wherein writing the sequence data into the memory comprises:
   disabling writing of the sequence data into the at least one faulty bit; and
   writing the sequence data into the at least one non-faulty bit in sequence.

4. The fault-mitigating method according to claim 3, wherein replacing the value on the bit corresponding to the at least one faulty bit in the sequence data with the value on the at least one non-faulty bit in the memory comprises:
   shifting a value of a non-faulty bit lower than the at least one faulty bit with the at least one faulty bit as a reference.

5. The fault-mitigating method according to claim 4, further comprising:
   filling a lower bit that does not have a value yet in the new sequence data with zero.

6. The fault-mitigating method according to claim 4, further comprising:
   filling a lower bit that does not have a value yet in the new sequence data with a value on an adjacent bit.

7. The fault-mitigating method according to claim 1, wherein the sequence data is the data related to the image, and replacing the value on the bit corresponding to the at least one faulty bit in the sequence data with the value on the at least one non-faulty bit in the memory comprises:
   replacing with a value on a non-faulty bit corresponding to sequence of the at least one faulty bit in a second sequence block of the memory, wherein data stored in the sequence block and the second sequence block corresponds to different channels of the neural network, and the at least one non-faulty bit is the at least one third bit.

8. A data processing circuit, comprising:
   a memory configured to store at least one of data related to an image, a weight for a multiply-accumulate operation for feature extraction of the image, and a value for an activation operation, and having at least one faulty bit;
   a multiply accumulator configured to perform the multiply-accumulate operation; and
   a controller coupled to the memory and the multiply accumulator, and configured to:

write sequence data into the memory, wherein a number of bits of the sequence data is equal to a number of bits for storing data in a sequence block of the memory;

access the sequence data from the memory, comprising:
ignore access to the at least one faulty bit in the memory; and
replace a value on a bit corresponding to the at least one faulty bit in the sequence data with a value on at least one non-faulty bit in the memory to form new sequence data, wherein the multiply accumulator performs the multiply-accumulate operation on the new sequence data,
at least one value on at least one first bit in the new sequence data is equal to at least one value on at least one second bit in a same new sequence data, at least one value on at least one third bit in another new sequence data of another channel of a neural network, or zero.

9. The data processing circuit according to claim 8, wherein the controller is further configured to:
replace with the value on the at least one non-faulty bit adjacent to the at least one faulty bit in the sequence data, wherein the at least one non-faulty bit is the at least one second bit.

10. The data processing circuit according to claim 8, wherein the controller is further configured to:
disable writing of the sequence data into the at least one faulty bit; and
write the sequence data into the at least one non-faulty bit in sequence.

11. The data processing circuit according to claim 10, wherein the controller is further configured to:
shift a value of a non-faulty bit lower than the at least one faulty bit with the at least one faulty bit as a reference.

12. The data processing circuit according to claim 11, wherein the controller is further configured to:
fill a lower bit that does not have a value yet in the new sequence data with zero.

13. The data processing circuit according to claim 11, wherein the controller is further configured to:
fill a lower bit that does not have a value yet in the new sequence data with a value on an adjacent bit.

14. The data processing circuit according to claim 8, wherein the sequence data is the data related to the image, and the controller is further configured to:
replace with a value on a non-faulty bit corresponding to sequence of the at least one faulty bit in a second sequence block of the memory, wherein data stored in the sequence block and the second sequence block corresponds to different channels of the neural network, and the at least one non-faulty bit is the at least one third bit.

* * * * *